United States Patent
Fröhlich et al.

(10) Patent No.: US 9,571,046 B2
(45) Date of Patent: Feb. 14, 2017

(54) AMPLIFIER CIRCUIT FOR A TWO-WIRE INTERFACE

(75) Inventors: Thomas Fröhlich, Ottikon (CH); Wolfgang Dünser, Rapperswil-Jona (CH)

(73) Assignee: AMS AG, Unterpremstaetten (AT)

( * ) Notice: Subject to any disclaimer, the term of this patent is extended or adjusted under 35 U.S.C. 154(b) by 567 days.

(21) Appl. No.: 13/994,677

(22) PCT Filed: Dec. 7, 2011

(86) PCT No.: PCT/EP2011/072082
§ 371 (c)(1),
(2), (4) Date: Aug. 26, 2013

(87) PCT Pub. No.: WO2012/080059
PCT Pub. Date: Jun. 21, 2012

(65) Prior Publication Data
US 2014/0010386 A1    Jan. 9, 2014

(30) Foreign Application Priority Data

Dec. 17, 2010    (DE) .................. 10 2010 054 897

(51) Int. Cl.
*H03F 3/185*    (2006.01)
*H03F 3/70*    (2006.01)
(Continued)

(52) U.S. Cl.
CPC .............. *H03F 3/185* (2013.01); *H03F 3/70* (2013.01); *H04R 1/04* (2013.01); *H04R 3/00* (2013.01);
(Continued)

(58) Field of Classification Search
CPC ........ H03F 3/185; H03F 3/70; H03F 2200/03; H03F 220/48; H04R 1/04; H04R 3/00; H04R 19/016
(Continued)

(56) References Cited

U.S. PATENT DOCUMENTS 4,214,215 A * 7/1980 Mellen .................. H03F 3/1855
330/277
5,239,579 A * 8/1993 Schuh .................. H04M 1/6008
379/388.03

(Continued)

FOREIGN PATENT DOCUMENTS

WO    2007/108929 A2    9/2007
WO    2008/100055 A2    8/2008

OTHER PUBLICATIONS

Y. Haga et al.: "Class-AB Rail-to-Rail CMOS Buffer with Bulk-Driven Super Source Followers", European Conference on Circuit Theory and Design, Aug. 23-27, 2009, Antalya, Turkey (ECCTD 2009). IEEE, pp. 695-698.
(Continued)

*Primary Examiner* — Thomas Alunkal
(74) *Attorney, Agent, or Firm* — McDermott Will & Emery LLP

(57) ABSTRACT

The invention relates to an amplifier circuit (10a, 10b) for a two-wire interface, comprising a first current path (1), comprising a voltage-controlled current source (T1) having a gate (GT1), which is connected to an input connection (E1) of the amplifier circuit. A second current path (2) of the amplifier circuit comprises a voltage-controlled current source (T2), which is connected in series with the second resistor (R2). The first resistor (R1) and a parallel connection of the first and second current paths (1, 2) are connected in series between an output connection (A) and a reference voltage connection (B) of the amplifier circuit. The amplifier
(Continued)

circuit (10a, 10b) makes it possible to adjust the gain and to provide a supply voltage and a useful signal over a common conducting track (L).

14 Claims, 3 Drawing Sheets

(51) Int. Cl.
*H04R 1/04* (2006.01)
*H04R 3/00* (2006.01)
*H04R 19/01* (2006.01)

(52) U.S. Cl.
CPC ....... *H03F 2200/03* (2013.01); *H03F 2200/48* (2013.01); *H04R 19/016* (2013.01)

(58) Field of Classification Search
USPC .................................................. 381/28, 120
See application file for complete search history.

(56) References Cited

U.S. PATENT DOCUMENTS

| | | | |
|---|---|---|---|
| 6,160,450 A | 12/2000 | Eschauzier et al. | |
| 6,405,164 B1* | 6/2002 | Pinai | G06F 17/274 704/9 |
| 2004/0085137 A1* | 5/2004 | Furst | H03F 3/185 330/311 |
| 2007/0217628 A1* | 9/2007 | Boor | H04R 3/002 381/111 |
| 2008/0036540 A1 | 2/2008 | Frohlich et al. | |
| 2010/0102886 A1* | 4/2010 | Onodera | H03F 1/32 330/277 |
| 2010/0109779 A1 | 5/2010 | Pham et al. | |
| 2010/0182086 A1 | 7/2010 | Cozzolino | |
| 2012/0146733 A1* | 6/2012 | Matsuzuka | H03F 1/0261 330/296 |

OTHER PUBLICATIONS

A.J. Lopez-Martin et al.: "Power-efficient Class AB CMOS Buffer", IEEE J. Electronics Letters, Jan. 15, 2009, vol. 45, No. 2, pp. 89-90.

* cited by examiner

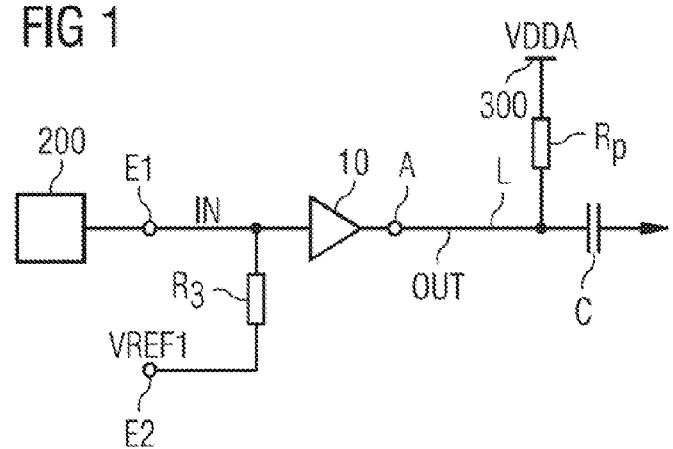
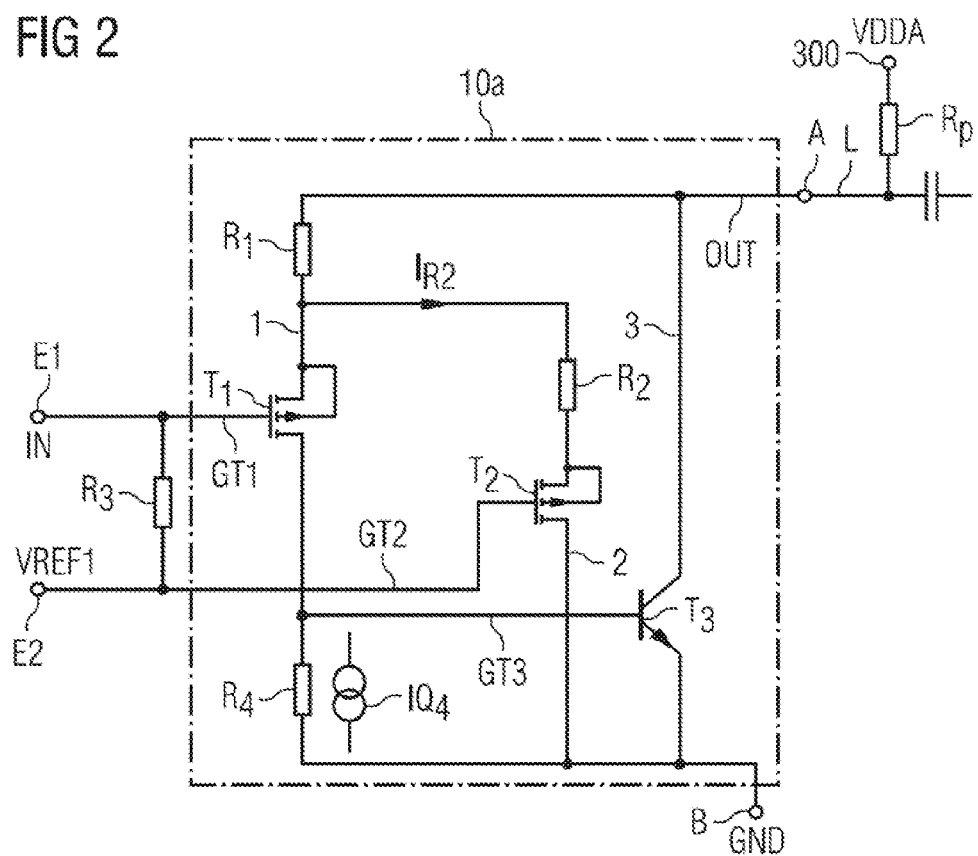

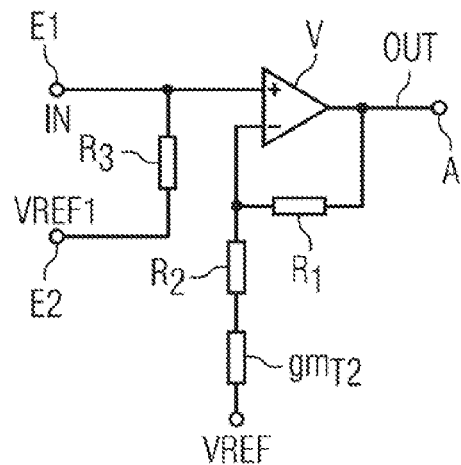
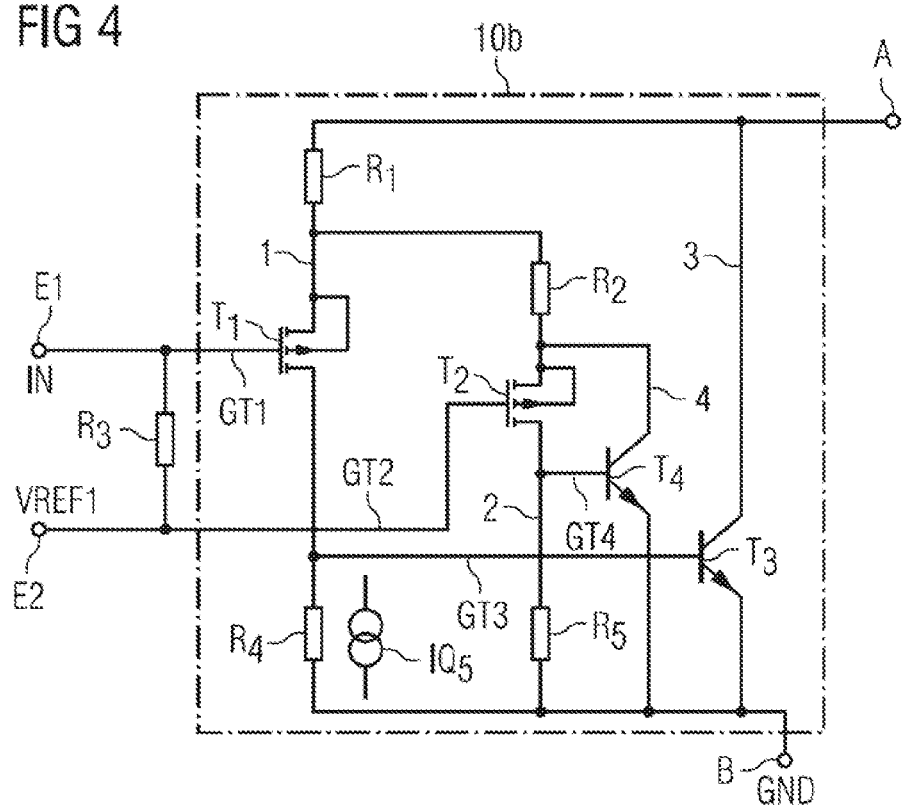

AMPLIFIER CIRCUIT FOR A TWO-WIRE INTERFACE

The invention relates to an amplifier circuit for a two-wire interface, suitable for amplifying voice signals from a microphone. The invention further relates to a microphone amplifier that is suitable for amplifying voice signals from a microphone.

Amplifier circuits that route the amplified voice signals to circuits for further signal processing such as analog-digital converters are used to amplify voice signals. The amplifier circuits form an interface between the microphone and the downstream circuits for further signal processing.

Microphones of the ECM (electret condenser microphones) type are generally connected to amplifier circuits that are used as a two-wire interface. In such an amplifier circuit, the voltage supply and the amplified signal are carried via a common line. Source-follower circuits can be used as suitable amplifier circuits, for example. Gains of approximately 1 can be achieved with such amplifier circuits for amplifying voice signals from a microphone.

Particularly for amplifying voice signals from a microphone, however, it is desirable in many cases to provide an amplifier circuit that can be used as a two-wire analog interface, so that the voltage supply and the signal transmission take place via a common line and with which a gain greater than 1 can be realized.

An object of the present invention is to specify an amplifier circuit for a two-wire analog interface in which the gain can be adjusted in a simple manner. Another object of the present invention is to specify a microphone amplifier with which signals, in particular acoustic signals from a microphone, can be amplified in a simple and reliable manner, and the connection between the amplifier circuit and downstream circuits can be made with the least possible wiring effort.

According to one embodiment, the amplifier circuit for a two-wire interface comprises an input terminal for application of the input signal, an output terminal for coupling out an output signal, a reference voltage terminal for applying a reference potential, a first resistor and a second resistor. The amplifier circuit further comprises a first current path that contains a voltage-controlled current source with a control terminal. The control terminal of the voltage-controlled current source in the first current path is connected to the input terminal. The amplifier circuit further comprises a second current path, which has a voltage-controlled current source, wherein the voltage-controlled current source of the second current path is connected in series to the second resistor. The first and second current paths are arranged in a parallel circuit. The first resistor and the parallel circuit of the first and second current path are connected in series between the output terminal and the reference voltage terminal.

The amplifier circuit has a high input impedance and a low output impedance. A voltage supply and a useful signal can be provided at the output terminal via the same printed conductor. The gain of the circuit can advantageously be adjusted substantially via the ratio of the first and second resistors. The amplifier circuit can be used as a two-wire analog interface between a microphone and downstream circuit components for signal processing. The amplifier circuit can be used in particular in a microphone amplifier.

An embodiment of such a microphone amplifier can comprise an input terminal for the application of an input signal, and an output terminal for outputting an output signal and an additional output terminal for outputting an additional output signal. The microphone amplifier can comprise an amplifier circuit for generating the output signal by amplifying the input signal according to the above specified embodiment type. The microphone amplifier can further comprise a voltage generator for generating an additional output signal with a supply voltage terminal for the application of a supply voltage. The amplifier circuit is connected between the input terminal of the microphone amplifier and the output terminal of the microphone amplifier in such a manner that the input terminal of the amplifier circuit is connected to the input terminal of the microphone amplifier and the output terminal of the amplifier circuit is connected to the output terminal of the microphone amplifier. The voltage supply terminal of the voltage generator is additionally connected to the output terminal of the microphone amplifier.

The invention will be explained in detail below with reference to figures that show example embodiments of the present invention.

FIG. 1 shows an embodiment of an arrangement with a microphone and an amplifier circuit for amplifying audio signals from the microphone.

FIG. 2 shows an embodiment of an amplifier circuit for a two-wire analog interface.

FIG. 3 shows an AC voltage small-signal equivalent circuit of an amplifier circuit for a two-wire analog interface.

FIG. 4 shows an additional embodiment of an amplifier circuit for a two-wire analog interface.

Figure 5:
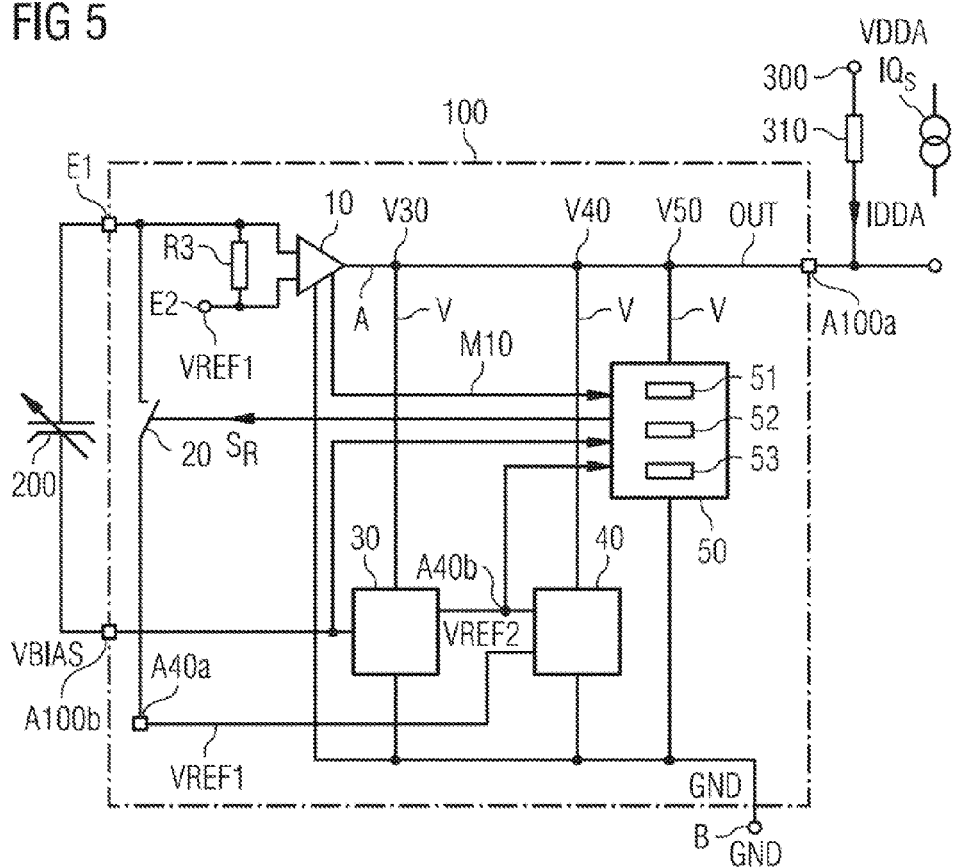
FIG. 5 shows a microphone amplifier for amplifying audio signals from a MEMS microphone.

FIG. 1 shows a circuit arrangement for amplifying voice signals from a microphone 200. The microphone 200 can be a microphone of the ECM (electret condenser microphone) type or a microphone of the MEMS (Microelectromechanical Systems) type, which is connected to an input terminal E1 of amplifier circuit 10. The amplifier circuit 10, which is connected via its input terminal E1 to the microphone 200, is provided for amplifying audio signals from a microphone. The output signals of the microphone are thus fed to the amplifier circuit 10 as input signals IN via the input terminal E1.

Another input terminal E2 of the amplifier circuit 10 is connected via a resistor $R_3$ to the input terminal E1 of the amplifier circuit. A reference signal VREF1, a reference voltage for example, is present at the input terminal E2. A DC voltage level at the input E1 is defined by the reference voltage VREF1. Especially if the amplifier circuit 10 is used in connection with a MEMS microphone, it is necessary to define a DC voltage at the input terminal E1, because the MEMS microphone supplies only an AC voltage at the input terminal E1. The resistance of $R_3$ can be on the order of several hundred ohms, for example 500Ω, up to several teraohms, for example up to 100 TΩ.

A supply voltage source 300 for providing a supply voltage VDDA is further provided. The supply voltage source 300 can be a direct current source, which is connected via a resistor $R_p$ and a conductor trace L to the output terminal A of the amplifier circuit 10. At its output terminal A, the amplifier circuit 10 produces the amplified output signal OUT, which can be supplied via a separating capacitor C to circuitry components for further signal processing.

FIG. 2 shows an embodiment 10a of the amplifier circuit 10 for amplification of the input signal IN. The output signal A of the amplifier circuit 10a is connected via a resistor $R_1$ to a current path 1. A voltage-controlled current source $T_1$ is provided in the current path 1. The voltage-controlled current source $T_1$ can be constructed as a transistor, i.e. a MOSFET transistor. In addition, a resistor $R_4$ is connected in series to the voltage-controlled current source $T_1$ in the current path 1. The current path 1 or the voltage-controlled current source $T_1$ and the resistor R are thus connected between the resistor $R_1$ and a reference voltage terminal B for application of a reference potential GND, for example a ground potential. Alternatively, a current source $IQ_4$ can be used in place of $R_4$.

The embodiment 10a of the amplifier circuit 10 also has a current path 2, which comprises a voltage-controlled current source $T_2$. A resistor $R_2$ is connected in series to the current path 2 or the voltage-controlled current source $T_2$. The series connection consisting of the resistor $R_2$ and the current path 2 or the voltage-controlled current source $T_2$ is connected in parallel to the current path 1.

The embodiment 10a of the amplifier circuit also has a current path 3, which comprises a voltage-controlled current source $T_3$. The current path 3, and thus the voltage-controlled current source $T_3$, is connected in parallel to the series circuit consisting of the resistor $R_1$ and the current path 1 between the output terminal A and a reference voltage terminal B.

A control terminal GT1 of the voltage-controlled current source $T_1$ is connected to the input terminal E1 in order to apply the input signal IN. The voltage-controlled current source $T_2$ has a control terminal GT2, which is connected to the input terminal E2 in order to apply the reference signal VREF1. A control terminal GT3 of the voltage-controlled current source $T_3$ is connected on the current path 1 between the voltage-controlled current source $T_1$ and the resistor $R_4$.

The mode of operation of embodiment 10a of the amplifier circuit 10 will be explained below. The amplifier circuit can be used to amplify audio signals from a microphone that is connected to the input terminal E1. A resistor $R_3$ can be connected between the input terminal E1 and the input terminal E2, especially when an ECM microphone or a MEMS microphone is being used. An ECM microphone or a MEMS microphone only provides an AC voltage signal at the input terminal E1. A DC voltage level is defined at the input terminal E1 by coupling the reference DC voltage VREF1 at the input terminal E2, because the input terminals E1 and E2 are decoupled via the resistor $R_3$.

Providing the resistor $R_3$ between the input terminal E1 and the input terminal E2 of the amplifier circuit 10a is optional. If a signal source that generates a DC voltage level is connected to the input terminal E1, the resistor $R_3$ can be omitted and the input terminals E1 and E2 can be decoupled from one another.

The resistor $R_3$ can be realized by two diodes connected back-to-back, for example. In that way, a high input impedance for the amplifier circuit 10a can be realized, in particular for the case when an ECM microphone or a MEMS microphone is connected to the input terminal E1. The resistor $R_3$ can have resistance values in the range between 500Ω and 100 TΩ, for example.

A supply voltage source 300 for providing the supply voltage VDDA is connected via a resistor $R_p$ to the input terminal A of the amplifier circuit in order to provide a supply voltage for the amplifier circuit 10a. When the input signal IN is supplied at the control terminal GT1 of the transistor $T_1$, the output signal OUT is generated at the output terminal A after amplification of the input signal IN.

The resistor $R_p$ and the output impedance of the amplifier circuit 10a and the output terminal A form a voltage divider, which leads to the damping of the output signal OUT. The transistor $T_3$ is connected between the output terminal A and the reference potential terminal B in order to reduce the output impedance. If a current from the source terminal of the transistor $T_2$ flows via the source-drain path of the transistor $T_1$, the current generates a voltage drop across the resistor $R_4$. If the current is increasing, the voltage drop across the resistor $R_4$ increases. The increased voltage drop across the resistor $R_4$ causes the transistor $T_3$ to become conductive. From this point on, the current through the transistor $T_1$ remains constant. A rising current at the output terminal A that flows into the amplifier circuit is diverted via the transistor $T_3$ to the reference voltage terminal B. If a current flows across the transistor $T_3$ occurs, the impedance at the output terminal A becomes very low. The feedback formed by the transistor $T_3$ and the resistor $R_4$ thus leads to the reduction of the output impedance of the amplifier circuit, so that the gain of the circuit arrangement 10a becomes nearly load-independent.

An amplification can be produced by the parallel connection of the current path 2 to the current path 1. As a result of applying the reference potential VREF1 to the input terminal E2, a defined, nearly constant voltage appears between the control terminal GT2 and the source terminal of the transistor $T_2$. If the voltage at the input terminal E1 varies, the voltage at the source terminal of the transistor $T_1$ behaves like the input signal IN at the input terminal E1, apart from a DC offset. The input signal IN is thus converted into a current $I_{R2}$ via the resistor $R_2$. Because the same DC voltage level is present at the source terminal of the transistor $T_1$ and at the source terminal of the transistor $T_2$, the circuit arrangement allows only an amplification of the input-side applied AC voltage signal. Due to the resistor $R_1$ and the resistor $R_2$, a signal-dependent current flows via the transistor $T_2$ to the reference voltage terminal B. The transistor $T_2$ functions as an impedance converter with a high-ohmic input impedance and a low-ohmic output impedance.

Together with the resistor $R_4$, the transistor $T_1$ forms a first amplifier stage. The gain of this stage is $A=gm(T1)\times R_4$, where gm(T1) designates the transconductance of the transistor $T_1$. A second amplifier stage is formed by the transistor $T_3$ and the load at the output terminal A. The control terminal GT2 of the transistor $T_2$ forms the second input terminal of the amplifier circuit. In one possible embodiment, the same reference DC voltage level VREF1 is fed to the control terminal GT2 of the transistor $T_2$ as that at the control terminal GT1 of the transistor $T_1$, so that the source voltage at the transistor $T_2$ nearly agrees with the source voltage of the transistor $T_1$. Thereby a DC offset at the output terminal A is prevented. The transistor $T_2$ is thus operated as a voltage generator. In one possible embodiment, the input terminal E2 can be connected to the reference voltage terminal B.

The gain of the circuit arrangement 10 can be adjusted by means of the resistors $R_1$ and $R_2$. FIG. 3 shows the AC voltage small signal equivalent circuit diagram of the circuit arrangement 10a for the amplifier circuit form FIG. 2. In the equivalent circuit diagram of FIG. 3, the transistors $T_1$, $T_3$ and the resistor $R_4$ are combined in the amplifier unit V. The amplifier unit V is connected between the input terminal E1 for application of the input signal IN and the output terminal A for generating the output signal OUT. In order to define a DC voltage level at the input terminal E1, the input terminal E2 for application of the reference voltage VREF1 is connected via the resistor $R_3$ to the input terminal E1. The input terminal E1 is connected to the non-inverting input terminal of the amplifier unit V. The inverting input terminal of the amplifier circuit is connected to the reference voltage VREF1 via the resistor $R_2$ and the transconductance $gm_{T2}$ of the transistor $T_2$. The output terminal A of the amplifier circuit V is coupled back to the inverting input terminal via the resistor $R_1$. Under the assumption of an infinite loop gain for the amplifier unit V, the AC voltage small-signal equivalent circuit diagram yields a gain A of the circuit of:

$$A \approx 1 + \frac{R_1}{R_1 + \frac{1}{gm_{t2}}}$$

FIG. 4 shows another embodiment 10b of the amplifier circuit for amplifying audio signals from the microphone. Identical circuit elements in FIG. 2 and FIG. 4 are represented with the same symbols. With regard to the basic mode of operation of the circuit arrangement 10b shown in FIG. 4, the reader is referred to the explanations in relation to FIG. 2. Only the differences in the two circuit variants will be discussed below.

In comparison to the circuit arrangement 10a, the circuit arrangement 10b has an additional current path 4. The current path 4 contains the voltage-controlled current source $T_4$, which can be constructed as a transistor, for example. In the current path 2, a resistor $R_5$, which is connected to the reference voltage terminal B, is connected in series to the voltage-controlled current source $T_2$. Alternatively, a current source $IQ_5$ can be provided in place of the resistor $R_5$. The transistor $T_4$ is connected in parallel to the current path 2. A control terminal GT4 of the transistor $T_4$ is connected to the current path 2 between the transistor $T_2$ and the resistor $R_5$. Adding the current path 4 and the resistor $R_5$ reduces the influence of the transconductance $gm_{T2}$ of the transistor $T_2$ on the gain A of the amplifier circuit. Due to the feedback formed by the transistor $T_4$ and the resistor $R_5$, the impedance at the source terminal of $T_2$ becomes very low.

In the embodiments of the amplifier circuit shown in FIGS. 2 and 4, the transistors $T_1$ and $T_2$ are constructed as MOSFET transistors, in particular as p-channel MOSFET transistors. The transistors $T_3$ and $T_4$ are constructed as bipolar transistors, in particular as npn bipolar transistors. According to another embodiment, the transistors $T_1$ and $T_2$ can be constructed as bipolar transistors and the transistors $T_3$ and $T_4$ can be constructed as MOSFET transistors.

The circuit arrangements of the amplifier circuits 10a and 10b shown in FIGS. 2 and 4 are designed in particular for an application in which the supply voltage source 300 provides a supply voltage VDDA with a level above the reference potential present at the reference voltage terminal B. If the voltage source 300 provides a voltage that is lower compared to the reference potential at the reference voltage terminal B, n-channel MOSFET transistors can be used instead of the p-channel MOSFET transistors $T_1$ and $T_2$. In this case, the transistors $T_3$ and $T_4$ can be constructed as pnp bipolar transistors.

The embodiments 10a and 10b of the amplifier circuits have a high input impedance and a low output impedance. The amplifier circuit additionally has a high input dynamic range as well as low noise and low distortion for high input signals. The gain A of the amplifier circuit can be adjusted by appropriate scaling of the resistors $R_1$ and $R_2$.

The amplifier circuits 10a and 10b can be used as two-wire analog interfaces, with which the supply voltage and the useful signal at the output terminal A can be provided via a common line in modulation operating mode. Thus the amplifier circuit can be used in particular for amplifying audio output signals from ECM microphones or MEMS microphones.

FIG. 5 shows an embodiment of a MEMS microphone amplifier comprising an amplifier circuit 10, which is connected between an input terminal E1 of the microphone amplifier for the application of an input signal IN and an output terminal A100a of the microphone amplifier for outputting an output signal OUT. The amplifier circuit 10 can be constructed according to the embodiment variant 10a or the embodiment variant 10b for example. Because the input side of the amplifier circuit is connected to the input terminal E1, the input terminal E1 of the microphone amplifier simultaneously constitutes an input terminal of the amplifier circuit. The output terminal A100a of the microphone amplifier likewise constitutes an output terminal of the amplifier circuit 10, because the amplifier circuit 10 is connected on the output side to the microphone amplifier.

For example, the input signal IN can be a signal that is provided from a microphone such as a MEMS microphone connected to the input terminal E1. The amplifier circuit 10 amplifies the input signal IN and generates the output signal OUT on the output side at the output terminal A100a. A reference signal VREF1 can additionally be provided at the input terminal E1 via a controllable switch 20. The reference signal VREF1 can likewise be fed to an additional input terminal E2 of the amplifier circuit. The resistor $R_3$, the function of which has already been explained based on the amplifier circuits 10a and 10b, is connected between the input terminal E1 and the input terminal E2.

The microphone amplifier further comprises a voltage generator 30, which provides an additional output signal VBIAS at an output terminal A100b of the microphone amplifier. The additional output signal can be used for example as a precharge voltage for the diaphragm of the microphone connected to the microphone amplifier. The microphone amplifier further comprises a voltage/current generator 40 for generating the reference signal VREF1. The reference signal VREF1 is generated at an output terminal A40a of the voltage/current generator 40 and can be supplied via the controllable switch 20 to the input terminal E1 of the microphone amplifier. The voltage/current generator 40 is thus connected on the output side via the controllable switch to the input terminal E1 of the amplifier circuit 10. The voltage/current generator 40 also provides an additional reference signal VREF2 for the voltage generator 30 at an additional output terminal A40b of the voltage/current generator. The reference signal VREF2 is used for the voltage generator 30 as a reference voltage for generating the level of the output signal VBIAS. The reference signal VREF2 can also have the same level as VREF1.

In order to operate the voltage generator 30 and the voltage/current generator 40, a supply voltage terminal V30 of the voltage generator 30 and a supply voltage terminal V40 of the voltage/current generator 40 are each provided for the application of a supply voltage V. In the embodiment of a microphone amplifier shown in FIG. 5, the supply voltage terminals V30 and V40 are not connected to a specially provided terminal on the housing of the microphone amplifier for the application of an external supply voltage. Instead, the supply voltage terminals V30 and V40 are connected to the output terminal A100a of the amplifier circuit 10, or the microphone amplifier 100. The supply voltage for the voltage generator 30 and the current/voltage generator 40 is thus defined by the amplifier circuit 10. The level of the supply voltage therefore results from the level of the reference voltage VREF1 plus the amplifier voltage offset between the input terminal E1 and the output terminal A. The required feed current IDDA is provided by the supply voltage source 300 and a resistor 310. The supply voltage source 300 is connected for this purpose via the resistor 310 or alternatively via a current source $IQ_S$ to the output terminal A100a of the amplifier circuit 10.

In order to operate the microphone connected between the input terminal E1 and the output terminal A100b, the voltage generator 30 provides an output signal VBIAS, which is provided in particular as the precharge voltage for the microphone diaphragm of a MEMS microphone when a MEMS microphone is connected to the microphone amplifier. At the input terminal E1, the microphone supplies the input signal IN, which is fed on the input side to the amplifier circuit 10. After an amplification of the signal IN, the amplifier circuit 10 generates the amplified output signal OUT at the output terminal A100a. In addition, the amplifier circuit 10, in connection with the supply voltage VDDA fed at the output terminal A100a, generates the supply voltage V for the voltage generator 30 and the voltage/current generator 40.

During proper operation, the amplifier circuit 10 generates the output signal OUT at a level above a threshold value of the supply voltage V which is necessary for operation of the voltage generator 30, in particular for generating the output signal VBIAS at a target level. The target level of the output signal VBIAS can be a level necessary for generating the precharge voltage of the microphone. In addition, the amplifier circuit 30 generates the output signal OUT during proper operation at a level above a threshold value of the supply voltage V that is necessary for operation of the voltage/current generator 40, in particular for generating the reference signals VREF1 and VREF2 at a target level. The target level of the reference signal VREF2 can be a level necessary for generating the output signal VBIAS.

In the event that a signal with a large amplitude appears at the input terminal E1, the amplifier 10 is driven at a level above that for its proper operation. Such a fault state can occur if a high noise level appears at the diaphragm of the microphone, for example. An explosion or sounds from the wind can be mentioned as examples, which exert a high sound pressure on the microphone diaphragm.

If the amplifier circuit 10 is operated in improper operation due to the fault event, a level of the output signal OUT can be generated at the output terminal A100a that is too low to feed a sufficiently high supply voltage to the voltage generator 30 or the voltage/current generator 40. Due to the decrease of the output voltage OUT in such faults, the voltage generator 30 generates the output signal VBIAS at an excessively low level, for example a level that is below the minimum level needed for generating a precharge voltage necessary for the microphone diaphragm.

The voltage/current generator 40 can also be affected by the excessively low output voltage at the output terminal A100a and, due to the decrease of the DC voltage level of the output signal OUT, generates the reference signal VREF2 at an excessively low level, so that the voltage generator 30 generates the output signal VBIAS at an excessively low level.

The low level of the output signal VBIAS at the output terminal A100b causes the level of the precharge voltage for the microphone diaphragm to be reduced. This leads to a further decrease of the voltage at the input terminal E1 and the output terminal A. This positive feedback results in a fault that leads to non-functionality of the microphone. Because of the high time constant at the input of the amplifier circuit 10, on the order of seconds up to minutes, the loss of function of the microphone can last for a rather long time, which is no longer acceptable in most application cases.

In order to quickly recognize the fault and restore the functionality of the microphone amplifier as quickly as possible so as to avoid a long failure of the microphone on the order of seconds, the microphone amplifier 100 comprises a control circuit 50 for switching the controllable switch into a first and a second state. For this purpose, the control circuit generates the control signal $S_R$.

The controllable switch 20 can be switched into the first or second state by the control signal $S_R$. In the first state, the controllable switch is controlled to be conductive or low-resistance and connects the output terminal A40a of the voltage/current generator 40 at a low resistance to the input E1 of the microphone amplifier. In the second state of the controllable switch, the switch 20 is controlled to be non-conductive or high-resistance, so that the output terminal A40a of the voltage/current generator 40 is disconnected from the input terminal E1 of the microphone amplifier, or is connected to it at a high resistance.

The amplifier circuit 10 is constructed in such a manner that it is switched back from the improper operating state into the proper operating state when the reference signal VREF1 is supplied to the input terminal E1 and the reference signal has a target level. The target level of the reference signal VREF1 is generated by the voltage/current generator 40 whenever the amplifier circuit 10 during proper operation provides a sufficiently high level of the output signal OUT at the output terminal A100a, which can be used as the supply voltage of the voltage/current generator 40. The control circuit 50 is designed to switch the controllable switch 20 from the second state to the first state if the control circuit 50 determines that the amplifier circuit 10 is being operated in a state outside of proper operation, or if the level of the reference signal VREF2 and the level of the output signal VBIAS are no longer being generated with the correct values.

The control circuit 50 can be designed to monitor the position of an operating point of the amplifier circuit 10, for example. The position of the operating point of the amplifier circuit 10 can be monitored by determining a voltage M10 characterizing the operating point, for example. A monitoring signal M10 is fed by the amplifier circuit 10 to the control circuit 50 on the input side in order to determine the operating point of the amplifier circuit. The monitoring signal M10 characterizes the position of the operating point of the amplifier circuit 10. The control circuit 50 can have a monitoring circuit 51 that evaluates the monitoring signal M10. For example, a voltage characterizing the operating point can be compared to a target level of the voltage.

If the monitoring circuit 51 determines that the operating point of the amplifier circuit 10 is outside the proper operating range of the amplifier circuit, i.e. outside the range in which the amplifier circuit 10 generates the output signal OUT at a sufficiently high level to feed a sufficiently high supply voltage to the voltage generator 30 or the voltage/current generator 40 in order to generate the output signal VBIAS or the reference signals VREF1 and VREF2, the controllable switch 20 is switched from the second to the first state by the control circuit 50 by means of the control signal $S_R$.

Additionally or alternatively to monitoring the position of the operating point for the amplifier circuit, the control circuit 50 can be used for monitoring a level of the reference signals VREF1 and/or VREF2 provided by the voltage/current generator 40. For this purpose, the level of the reference signal VREF1 and/or the reference single VREF2 can be fed on the input side to the control circuit 50 by connecting the control circuit 50 to the output terminal A40a and/or A40b, respectively, of the voltage/current generator 40. In this embodiment, the control circuit 50 can comprise a monitoring circuit 52 that evaluates the level of the reference signal VREF1 and/or the reference signal VREF2. If the monitoring circuit 52 determines that the level of the reference signal VREF1 and/or the reference signal VREF2 is above or below a target level of the reference signal, the control circuit 50 generates the control signal $S_R$ in such a manner that the controllable switch 20 is switched from the second to the first state.

In another embodiment, alternatively or additionally to monitoring the position of the operating point for the amplifier circuit, or the level of the reference signals VREF1 and VREF2, the output signal VBIAS generated on the output side by the voltage generator 30 can be fed to the control circuit 50. The control circuit 50 has a monitoring circuit 53 for monitoring the level of the output signal VBIAS. If the monitoring circuit 53 determines that the level of the output signal VBIAS exceeds a target level or falls below a target level, the control circuit 50 generates the control signal $S_R$ for switching the controllable switch 20 from the second to the first state.

By controlling the controllable switch 20 to be conductive or low-resistance, the reference signal VREF1 is fed at the input terminal E1 into the amplifier circuit 10. The input terminal E1 of the amplifier circuit, which is connected to the microphone, has a high impedance, for example an impedance in the range from several hundred ohms to several teraohms. For example, the impedance can be between 500Ω and 100 TΩ. The reference signal VREF1 has the effect that the input signal at the input terminal E1 has a high input mean value. During proper operation of the amplifier circuit, the reference signal VREF1 is connected via a high-resistance path to the input terminal E1. The high-resistance path can be formed for example by two back-to-back diodes.

Because of the high-resistance path via which the reference signal VREF1 reaches the amplifier circuit, a large time constant results and thus a long period of time of several seconds until the input terminal E1 charges itself to the level of the reference signal VREF1. When the controllable switch 20 is driven to conduct, the high-resistance path on which the reference signal is provided during proper operation of the amplifier is bridged with a low resistance, or is short-circuited. Thereby the reference signal generated by the voltage/current generator 40 can be fed via a low resistance to the input terminal E1. If the controllable switch is driven to conduct because the amplifier circuit is outside the proper operating state and thus in improper operation, the amplifier circuit 10 is very quickly switched back from the improper operating state into the proper operating state.

After the amplifier circuit has been switched back into the proper operating state, the output signal OUT again appears at the output of the amplifier circuit 10 with a sufficiently high DC voltage level to ensure proper operation of the voltage generator 30 and the voltage/current generator 40. During proper operation of the voltage generator 30, the voltage generator 30 produces the output signal VBIAS at a sufficiently high level to guarantee the functionality of the microphone 200. During proper operation of the voltage/current generator 40, the reference signals VREF1 and VREF2 are generated at a level that is necessary for the proper functionality of the voltage generator 30 and/or the amplifier circuit 10.

Thus the circuit shown in FIG. 5 for a microphone amplifier makes it possible to provide the supply voltage for the voltage generator 30 and the voltage/current generator 40 at the output terminal A100a of the amplifier circuit 10. An additional terminal for providing an external supply voltage for the voltage generator 30 or the voltage/current generator 40 is not necessary. The amplifier circuit is designed so that the level of the output signal OUT appearing at the output terminal A100 is sufficiently high to serve as a supply voltage for the control circuit 50, even during operation of the amplifier circuit in an improper operating mode.

The microphone amplifier 100 enables easy replacement of an ECM microphone by a MEMS microphone without the need for increased wiring expense. This is of particular interest especially for headset applications. Moreover, by saving a separate terminal for application of an external supply voltage for the voltage generator 30 or the voltage/current generator 40, it is possible to save valuable chip space.

LIST OF REFERENCE CHARACTERS 1, 2, 3, 4 Current path
10 Amplifier circuit
20 Controllable switch
30 Voltage generator
40 Voltage/current generator
50 Control circuit
100 Microphone amplifier
200 Microphone
300 Supply voltage source
VDDA Supply voltage source
B Reference voltage terminal
T Voltage-controlled current source/transistor
R Resistor
E Input terminal
A Output terminal
IN Input signal
VREF1, VREF2 Reference signal
OUT Output signal
GT Control terminal of the transistors

The invention claimed is:
1. An amplifier circuit for a two-wire interface, comprising:
   an input terminal for the application of an input signal;
   an output terminal for coupling out an output signal;
   a reference voltage terminal for the application of a reference potential;
   a first resistor;
   a second resistor;
   a first current path, comprising a voltage-controlled current source with a control terminal, wherein the control terminal of the voltage-controlled current source of the first current path is connected to the input terminal;
   a second current path, comprising a voltage-controlled current source, wherein the voltage-controlled current source of the second current path is connected in series to the second resistor; and
   a third current path, comprising a voltage-controlled current source having a control terminal,
   wherein the first and second current paths are arranged in a parallel circuit,
   wherein the first resistor and the parallel circuit of the first and second current paths are connected in series between the output terminal and the reference voltage terminal,
   wherein the third current path is connected between the output terminal and the reference voltage terminal, and wherein the control terminal of the voltage-controlled current source of the third current path is fed back to the first current path without an interconnection with the second current path.

2. The amplifier circuit according to claim 1, wherein the voltage-controlled current source of the second current path has a control terminal for application of a reference signal, and wherein the voltage-controlled current source of the second current path is constructed in such a manner that a fixed voltage potential is applied between the second resistor and the reference voltage terminal to the second current path when the reference signal is applied to the control terminal of the voltage-controlled current source in the second current path.

3. The amplifier circuit according to claim 1, wherein the first current path comprises a resistor or a current source, wherein the resistor of the first current path or the current source is connected between the voltage-controlled source of the first current path and the reference voltage terminal, wherein the voltage-controlled current source of the third current path comprises a control terminal, and wherein the control terminal of the controllable current source in the third current path is connected between the controllable current source of the first current path and the resistor of the first current path, or the current source.

4. The amplifier circuit according to claim 1, comprising:
a fourth current path, comprising a voltage-controlled current source with a control terminal,
wherein the second current path comprises a resistor or a current source,
wherein the resistor of the second current path or the current source of the second current path is connected between the voltage-controlled current source of the second current path and the reference voltage terminal, and
wherein the control terminal of the voltage-controlled current source in the fourth current path is connected between the controllable voltage source of the second current path and the resistor of the second current path or the current source of the second current path.

5. The amplifier circuit according to claim 4, wherein the voltage-controlled current sources of the first, second, third and fourth current paths are each constructed as transistors, in particular as MOSFET transistors or as bipolar transistors.

6. The amplifier circuit according to claim 1, wherein the input terminal and the control terminal of the voltage-controlled current source in the second current path are connected to one another via a third resistor.

7. A microphone amplifier, comprising:
an input terminal for the application of an input signal;
an output terminal for outputting an output signal;
an additional output terminal for outputting an additional output signal;
an amplifier circuit according to claim 1 for generating the output signal by amplifying the input signal;
a voltage generator for generating an additional output signal, with a supply potential terminal for the application of a supply voltage,
wherein the amplifier circuit is connected between the input terminal of the microphone amplifier and the output terminal of the microphone amplifier in such a manner that the input terminal of the amplifier circuit is connected to the input terminal of the microphone amplifier and the output terminal of the amplifier circuit is connected to the output terminal of the microphone amplifier, and
wherein the supply voltage terminal of the voltage generator is connected to the output terminal of the microphone amplifier.

8. The microphone amplifier according to claim 7, comprising:
a controllable switch that can be switched into a first and a second state, wherein in the first state, the controllable switch connects the input terminal of the microphone amplifier to a terminal for the application of a reference signal and the input terminal of the microphone amplifier is disconnected from the terminal for the application of a reference signal.

9. The microphone amplifier according to claim 8, wherein the control terminal of the voltage-controlled current source of the second current path is connected to the terminal for the application of a reference signal.

10. The microphone amplifier according to claim 9, wherein the amplifier circuit is constructed in such a manner that in a state of proper operation, the amplifier circuit generates the output signal at a level inside a voltage range of the supply voltage for the voltage generator, and in a state of improper operation, the amplifier circuit generates the output signal at a level outside the voltage range of the supply voltage for the voltage generator, the voltage range being required so that the voltage generator generates the additional output signal at a target level, and wherein the amplifier circuit is constructed in such a manner that it is switched back from the improper operating state into the proper operating state when the reference signal is supplied to the input terminal of the microphone amplifier and the reference signal has the target level.

11. The microphone amplifier according to claim 10, comprising:
a control circuit for controlling a first and second state of the controllable switch,
wherein the control circuit is constructed in such a manner that the control circuit switches the controllable switch from the second state into the first state if the control circuit determines that the amplifier circuit is being operated in an improper operating state.

12. The microphone amplifier according one of claims 8-11, comprising:
an additional voltage generator for generating the reference signal and an additional reference signal,
wherein the additional voltage generator has a voltage supply terminal for the application of the supply voltage,
wherein the supply voltage terminal of the additional voltage generator is connected to the output terminal of the microphone amplifier,
wherein the additional reference signal is fed to the voltage generator, and
wherein the voltage generator is constructed in such a manner that the voltage generator generates the additional output signal that is necessary for operation of a microphone connected to the additional output terminal if the additional voltage generator generates the additional reference signal at a level in a target level range of the additional reference signal.

13. The microphone amplifier according to claim 12, wherein the control circuit controls the state of the controllable switch based on the position of the operating point of the amplifier circuit or the level of the additional output signal or on the level of the additional reference signal.

14. A circuit arrangement for converting a voice signal into an electrical signal, comprising:
a microphone amplifier according to claim 8;
a microphone,
wherein the microphone is connected between the input terminal and the additional output terminal of the microphone amplifier, and
wherein the output terminal is connected via a resistor or a current source to a supply voltage source.

* * * * *